(12) United States Patent
McCammon et al.

(10) Patent No.: US 9,983,254 B2
(45) Date of Patent: May 29, 2018

(54) WIRELESS POWER LINE SENSOR

(71) Applicant: Sky Sight Technologies, LLC, Leo, IN (US)

(72) Inventors: Patrick McCammon, Leo, IN (US); Andrew Rekeweg, Woodburn, IN (US)

(73) Assignee: Sky Sight Technologies, LLC, Leo, IN (US)

(*) Notice: Subject to any disclaimer, the term of this patent is extended or adjusted under 35 U.S.C. 154(b) by 0 days. days.

(21) Appl. No.: 15/289,616

(22) Filed: Oct. 10, 2016

(65) Prior Publication Data
US 2017/0030956 A1 Feb. 2, 2017

Related U.S. Application Data

(62) Division of application No. 14/599,749, filed on Jan. 19, 2015.

(51) Int. Cl.
*G01R 31/02* (2006.01)
*G01R 31/08* (2006.01)
(Continued)

(52) U.S. Cl.
CPC ........... *G01R 31/08* (2013.01); *G01R 1/07* (2013.01); *G01R 15/142* (2013.01); *G01R 31/021* (2013.01); *H02N 2/181* (2013.01)

(58) Field of Classification Search
CPC ............ H02J 13/0075; H02J 7/1476; G01R 19/2513; G01R 13/021; G01R 1/07;
(Continued)

(56) References Cited

U.S. PATENT DOCUMENTS 4,801,937 A   1/1989  Fernandes
4,823,022 A * 4/1989  Lindsey ............... G01R 15/14
                                                    174/139

(Continued)

OTHER PUBLICATIONS

Igor Paprotney, Qiliang Xu, Wai Wah Chan, Richard M. White, and Paul K. Wright, Electromechanical Energy Scavenging from Current-carrying Conductors, IEEE Sensors Journal, 2011, 1-11, This article has been accepted for publication in a future issue of this journal, but has not been fully edited. Content may change prior to final publication.

(Continued)

*Primary Examiner* — Kristal Feggins
*Assistant Examiner* — Kendrick Liu
(74) *Attorney, Agent, or Firm* — George Pappas

(57) ABSTRACT

A wireless sensor apparatus for determining and reporting the status of an electrical wire, said sensor apparatus comprising: an electrically insulated housing; a non-contact electrical energy harvesting device, said energy harvest device disposed within said housing, said energy harvesting device comprising an electric current detector and voltage detector; an electric power source, said power source operatively connected to said energy harvesting device; a microcontroller, said microcontroller operably connected to said power source; a mechanically rigid base, said base operably connected to said housing and to said at least one strain gauge, said at least one strain gauge operably connected to said power source and to said microcontroller; a wireless data transmission antenna, said wireless data transmission antenna operably connected to said power source and to said microprocessor; a visual indicator, said visual indicator operably connected to said power source and to said microcontroller.

16 Claims, 9 Drawing Sheets

(51) Int. Cl.
*G01R 15/14* (2006.01)
*G01R 1/07* (2006.01)
*H02N 2/18* (2006.01)

(58) Field of Classification Search
CPC ........ Y04S 10/522; Y04S 20/36; H04M 9/00; G08B 23/00; H02N 2/181; G06F 19/00
See application file for complete search history.

(56) References Cited

U.S. PATENT DOCUMENTS

| | | |
|---|---|---|
| 5,414,344 A | 5/1995 | Chinn |
| 5,550,751 A | 8/1996 | Russell |
| 5,706,354 A | 1/1998 | Stroehlein |
| 5,896,258 A | 4/1999 | Cotton et al. |
| 6,002,260 A | 12/1999 | Lau et al. |
| 6,128,204 A | 10/2000 | Munro et al. |
| 6,177,884 B1 * | 1/2001 | Hunt ............... G01R 11/16 324/126 |
| 6,445,196 B1 | 9/2002 | White |
| 6,459,998 B1 | 10/2002 | Hoffman |
| 6,549,120 B1 | 4/2003 | De Buda |
| 6,829,724 B2 | 12/2004 | Farabaugh et al. |
| 6,879,479 B2 | 4/2005 | Colombo et al. |
| 6,914,763 B2 | 7/2005 | Reedy |
| 7,076,378 B1 | 7/2006 | Huebner |
| 7,113,134 B1 | 9/2006 | Berkman |
| 7,248,158 B2 | 7/2007 | Berkman et al. |
| 7,436,321 B2 | 10/2008 | White, II et al. |
| 7,453,352 B2 | 11/2008 | Kline |
| 7,525,423 B2 | 4/2009 | Berkman et al. |
| 7,626,489 B2 | 12/2009 | Berkman et al. |
| 7,675,408 B2 | 3/2010 | Kline |
| 7,701,325 B2 | 4/2010 | White, II |
| 7,705,747 B2 | 4/2010 | Twitchell, Jr. |
| 7,714,592 B2 | 5/2010 | Radtke et al. |
| 7,940,506 B2 | 5/2011 | Lewis |
| 8,077,049 B2 | 12/2011 | Yaney et al. |
| 8,336,352 B2 | 12/2012 | Abiprojo et al. |
| 8,509,953 B2 | 8/2013 | Taft |
| 8,674,843 B2 | 3/2014 | Bhageria et al. |
| 8,779,931 B2 | 7/2014 | Yaney et al. |
| 8,810,421 B2 | 8/2014 | Deaver, Sr. et al. |
| 9,412,254 B1 * | 8/2016 | Weiss ............... G08B 13/08 |
| 9,755,697 B2 | 9/2017 | Fuchs et al. |
| 9,762,289 B2 | 9/2017 | Henry et al. |
| 2009/0027061 A1 * | 1/2009 | Curt ............... H02J 13/0055 324/539 |
| 2010/0073182 A1 | 3/2010 | Gori |
| 2011/0060535 A1 * | 3/2011 | Arms ............... B60C 23/0411 702/34 |
| 2011/0288777 A1 | 11/2011 | Gupta |
| 2013/0257414 A1 * | 10/2013 | Cs ............... G01R 19/155 324/149 |
| 2016/0061603 A1 * | 3/2016 | Phillips ............... G01C 9/02 33/365 |

OTHER PUBLICATIONS

Eaton Corporation, Improving Outage Management, GridAdvisor Series II, Sep. 2013, 1-4, Publication No. B1150-13029, Cooper Power Systems by Eaton, USA.

Qiliang Richard Xu, Rafael Send, Igor Paprotny, Richard M. White and Paul K. Wright, Miniature Self-Powered Stick-On Wireless Sensor Node for Monitoring of Overhead Power Lines, Berkeley Sensor and Actuator Center, Department of Mechanical Engineering, and Department of Electrical Engineering and Computer Sciences of University of California, Berkeley, California, USA.

Power Donut2, The Instrumentation Platform for High Voltage Power Systems (Cell Phone Version), Aerial Conductor Installation, 1-2, Underground Systems Inc., Armonk, NY, USA.

Self-Powered Wireless Sensor Node for Monitoring of Overhead Power Lines, BMI—Berkeley Manufacturing Institute, http://bmi.berkeley.edu/ac-energy-harvesting/, Apr. 16, 2014.

Integrate Into a SCADA System to Improve System Reliability Using Wireless Sensor With Fault Detection, SEL: WSO-10 Wireless Sensor for Use With Landis+Gyr Radio Frequency Mesh Communications Network, SEL WSO-10 Data Sheet, 2013, Date Code: 20131216, 1-4, Schweitzer Engineering Laboratories, Inc, USA.

WSO-11 Wireless Sensor for Use With On-Ramp Total Reach Network, SEL: WSO-11 Wireless Sensor, SEL WSO-11 Data Sheet, 2013, Date Code: 20130624, 1-4, Schweitzer Engineering Laboratories, Inc, USA.

* cited by examiner

WIRELESS POWER LINE SENSOR

CROSS REFERENCE TO RELATED APPLICATIONS

This is a divisional of U.S. patent application Ser. No. 14/599,749, entitled "Wireless Power Line Sensor", filed Jan. 19, 2015, which is incorporated herein by reference.

BACKGROUND

1. Field of the Invention

The present invention relates generally to systems, methods, and apparatuses for determining the mechanical load and electrical energy status of a wire. More specifically, the present invention relates to the use of a non-contact sensor within an insulator to determine the electrical and mechanical "status" of a utility power distribution line.

2. Description of the Prior Art

The impact of severe weather events on critical infrastructure can have devastating impacts. With regard to the electricity subsector, 90% of all power outages occur on the distribution system. Severe storms and natural disasters can cause a variety of safety hazards including downed power lines which create a dangerous environment for those working to recover from the damages of a weather event. Downed power lines may still carry live, high voltage electricity. Contact with a downed, energized power line can cause severe injury or even lead to fatality. Safety is of utmost concern to the electric utilities and the highest priority is given to calls regarding downed power lines.

Utilities also receive substantial calls for downed power lines from the public that turn out to be other types of lines, such as communications lines, that do not pose the same threat; however, a response is required for all such calls. Crews are immediately dispatched to the affected areas to determine if the downed lines are power lines and if they are energized. If energized, the crew will cut power to the affected area until the lines can be safely restored. This response can drain a utility's resources, particularly after a large event as they must tend to all calls for downed lines, regardless of whether the lines are energized or not, before they can begin their damage assessment and restoration process for restoring power to the community. Additionally, a first responder's ability to access areas with downed power lines is hampered until a utility crew can physically come to the site to verify that any downed power lines are de-energized and the site is safe.

Thus, a need exists for a status indicator device for determining if a downed line is energized and relaying that status information to an electric utility as well as anyone who may be in the vicinity of the downed line. Ideally, the status indicator should be incorporated into hardware that is already present in a power distribution system, such as a power line "insulator."

Overhead conductors for high-voltage electric power transmission are bare, and are insulated by the surrounding air. Conductors for lower voltages in distribution may have some insulation but are often bare as well. Supports called insulators are required at points where conducting wires are supported by utility poles or transmission towers. Insulators are also required where wires enter buildings or electrical devices, such as transformers or circuit breakers, to insulate the wire from the case.

Insulators used for high-voltage power distribution are made from glass, porcelain, or composite polymer materials. Porcelain insulators are made from clay, quartz, or alumina and feldspar, and are covered with a smooth glaze to shed water. Insulators made from porcelain rich in alumina are used where high mechanical strength is a criterion. Porcelain has a dielectric strength of about 4-10 kV/mm. Glass has a higher dielectric strength, but it attracts condensation and the thick irregular shapes needed for insulators are difficult to cast without internal strains.

Recently, some electric utilities have begun converting to polymer composite materials for some types of insulators. These are typically composed of a central rod made of fibre reinforced plastic and an outer weathershed made of silicone rubber or ethylene propylene diene monomer rubber ("EPDM"). Composite insulators are less costly, lighter in weight, and have excellent hydrophobic capability. This combination makes them ideal for service in polluted areas.

The electrical breakdown of an insulator due to excessive voltage can occur a puncture arc or a flashover. A puncture arc is a breakdown and conduction of the material of the insulator, causing an electric arc through the interior of the insulator. The heat resulting from the arc usually damages the insulator irreparably. Puncture voltage is the voltage across the insulator that causes a puncture arc. A flashover arc is a breakdown and conduction of the air around or along the surface of the insulator, causing an arc along the outside of the insulator. Flashover voltage is the voltage that causes a flash-over arc. Most high voltage insulators are designed with a lower flashover voltage than puncture voltage, so they flash over before they puncture, to avoid damage.

Dirt, pollution, salt, and particularly water on the surface of a high voltage insulator can create a conductive path across it, causing leakage currents and flashovers. The flashover voltage can be reduced by more than 50% when the insulator is wet. High voltage insulators for outdoor use are shaped to maximise the length of the leakage path along the surface from one end to the other, called the creepage length, to minimise these leakage currents. To accomplish this, the surface is molded into a series of corrugations or concentric disc shapes. These usually include one or more sheds; downward facing cup-shaped surfaces that act as umbrellas to ensure that the part of the surface leakage path under the 'cup' stays dry in wet weather. Common insulator classes include: "pin type," "suspension," "strain," "shackle," "bushing," "line post," "cut-out," and "station post."

The pin type insulator is mounted on a pin on the pole cross-arm or directly on the pole. There is a groove on the upper end of the insulator. The conductor passes through this groove and is tied to the insulator with annealed wire of the same material as the conductor. Pin type insulators are used for transmission and distribution of electric power at voltages up to 33 kV. Beyond operating voltage of 33 kV, the pin type insulators become too bulky and hence uneconomical.

Higher voltage transmission lines usually use modular cap and pin insulator designs wherein wires are suspended from a "string" of identical disc-shaped insulators that attach to each other with metal clevis pin or ball and socket links. The advantage of this design is that insulator strings with different breakdown voltages, for use with different line voltages, can be constructed by using different numbers of the basic units. Also, if one of the insulator units in the string breaks, it can be replaced without discarding the entire string. Each unit is constructed of a ceramic or glass disc with a metal cap and pin cemented to opposite sides.

Ideally, a status indicator device should comprise a sensor node in conjunction with a visual or audio indicator. The device should capture the status of a downed line, and if the line is energized, an alarm, message, or notification should be sent to the utility's operations center, in addition to providing an indication of hazardous conditions to anyone in the vicinity of the downed line. If the downed line is not energized, the device must still provide a status both to the utility and to anyone in the vicinity. Additionally, as previously stated, a status indicator device should be incorporated into pre-existing system hardware, such as a power line "insulator." However, the known prior art devices (described below) fail to meet these needs.

U.S. Pat. No. 5,414,344 discloses an e-field sensing apparatus that detects the energization of high voltage utility transmission and distribution lines. An external housing substantially shields internal components of the apparatus from the detected E-field. A conductive wire extends from the housing where it is exposed to the E-field. A signal is induced onto the exposed wire and sensed by the apparatus. The length of exposed wire and the distance of the apparatus from the high voltage line attenuate the E-field so the induced signal is within operational parameters of internal sensing components. Adjustments to the wire length and apparatus distance enable detection of E-fields surrounding power lines carrying voltage levels of a predetermined voltage level (i.e. approximately 2000 volts and higher). In response to the E-field, the apparatus generates an analog output signal and a line isolation control (one-bit digital) signal. The analog output signal drives a meter, LED or other indicating device serving to aid maintenance engineers. The analog output also provides data to a SCADA or other control/indication system. The control signal drives a relay to a normally open position or trips the relay closed when the line power fails. The control drives motors to either maintain or isolate (shut down) power lines at a power substation.

U.S. Pat. No. 5,550,751 discloses a method and apparatus for detecting high impedance faults occurring on a distribution circuit coupled to an AC power source. Weighted multiple technique outputs are combined to determine whether a high impedance fault has occurred.

U.S. Pat. No. 5,706,354 discloses a device is connected in a signal path for canceling an unwanted noise signal induced by and correlated to the AC power line. The noise signal is assumed to have relatively constant phase (with respect to the AC power line) and amplitude during the period of use. The desired signal is assumed to be temporarily mutable for a brief period during which the noise signal is acquired. A manually- or automatically-adjusted gain (or attenuation) stage and overload detector are at the front-end of the waveform acquisition/playback block. A manually- or automatically-adjusted stage, typically linked to the earlier gain (attenuation) stage and with complementary attenuation (or gain) is at the back-end of the waveform acquisition/playback block. In this way, maximum performance can be realized from a waveform acquisition/playback block of lower resolution over a wide range of noise signal levels. The device acquires N samples of the noise signal over one or more periods of the AC power cycle and in synchrony with the AC power cycle. The sampling is terminated and the stored signals are played back with the correct amplitude and summed 180 degrees out-of-phase with the original noise signal.

U.S. Pat. No. 6,002,260 discloses a fault sensor suitable for use in a heterogenous power distribution system executes a stored program and causes sufficient information to be collected to distinguish a source of fault current as being from a public utility portion of the power distribution network or from a distributed generator. Short circuit current and magnetizing current are reliably distinguished based on differences in VI "signatures." In addition, the fault sensor periodically senses a condition of a battery of the fault sensor. When the condition of the battery indicates the battery power is low, the fault sensor sends a digital data signal including a low battery indication to a remote location. Subsequent to occurrence of a sustained power outage, the sensor detects that power has been restored and sends to a remote location a digital data signal including an indication that power has been restored. The sensor periodically measures peak line voltage and peak line current and reports peak values to the remote location.

U.S. Pat. No. 6,128,204 discloses a line power unit controls electrical power delivery to a grid from a three phase permanent magnet generator. A line power unit controller receives a power level command and controls a main inverter that draws DC power from a DC bus to deliver the commanded power to a grid. The DC bus is fed DC voltage via a three phase permanent magnet generator and a rectifier. The inverter delivers power to the grid via a filter, transformer and main contactor. The line power unit controller also controls the main contactor to break the connection with the grid. A precharge circuit draws power from the grid to precharge the DC bus to a precharge voltage. Alternatives include a start inverter separate from the main inverter that permits simultaneous delivery of power to the grid and commutation of the permanent magnet generator as a motor to spin an engine connected thereto at a speed sufficient to permit engine starting. Another alternative utilizes a single inverter for engine starting and power delivery which does not permit these operations to be simultaneously performed. Further alternatives include eliminating the transformer by utilizing a high-voltage rated main inverter.

U.S. Pat. No. 6,445,196 discloses a transformer test control device permits testing of an electrical transformer as installed on a power pole without connecting any high voltage of the power distribution line to the transformer. The test control device combines a visual indicator acting as both a power-on indicator and a fuse tester, a voltmeter, a voltage adjustment control, an operator control switch and a fuse as well as terminals for connecting both to an alternating current electrical supply and to the terminals of the primary coil of a transformer to be tested. Additionally, the test control device includes terminals for connecting the device and a secondary circuit to selected output terminals of the secondary coil of the transformer and additional terminals for receiving and retaining the contact portions of voltmeter test probes. This device may be embodied to include a dedicated second voltmeter. The test control device may be powered by either normal 120 volt line voltage or the output of a power inverter connected to the electrical system of a truck or other motor vehicle in those areas without readily available 120 volt AC power.

U.S. Pat. No. 6,459,998 discloses a system by which a "downed" power line is detected by sensing whether there is an open circuit along the power line and producing an indication that an open circuit condition exists. In response to an indication that an open circuit condition exists, the system compares the nature of the voltage and/or current signals present on the power line at the time an open circuit condition is indicated to exist, with a preprogrammed stored condition which includes typical signals to be expected when a "break" occurs along a power line. When a downed power line is detected, power is then removed from the affected line.

U.S. Pat. No. 6,549,120 discloses a powerline communication system including a transmitter having a pair of terminals for connection to the power lines. The transmitter comprises a carrier frequency generator for generating a carrier frequency modulated by the data signal and a switching circuit connected to the carrier frequency generator for being switched by the carrier frequency generator for generating a carrier signal having the carrier frequency. The switching circuit is connected to the terminals for providing the generated carrier signal thereto. The switching circuit comprises at least one storage means for storing energy when generating a portion of a cycle of the carrier signal and providing the stored energy when generating another portion of the cycle of the carrier signal. The system also comprises a receiver coupled to the power lines. The receiver includes a filter means for filtering the carrier signal from the power line signal and a demodulator connected to the filter means for extracting the data signal from the carrier signal. Both the transmitter and receiver may utilize a digital algorithm in a computing device to synchronize the carrier signal to the power line frequency to adaptively track changes in the power line frequency to minimize interference with power line harmonics and provide accurate frequency alignment between the transmitter and receiver.

U.S. Pat. No. 6,829,724 discloses a method for battery condition testing. In one embodiment, the method is comprised of interrupting AC power service to a data storage system. The interruption causes an exhaustible power source to provide operating power to the data storage system. The exhaustible power source is coupled to said data storage system. The exhaustible power source is adapted to provide operating power to the data storage system when the AC power service to the data storage system is interrupted. The method is further comprised of discharging the exhaustible power source by operating the data storage system with the exhaustible power source for a specified period of time less than full discharge but sufficient to fully flush the cache. The exhaustible power source passes the condition testing provided the exhaustible power source provides operating power to the data storage system for the specified period of time. The method is further comprised of recharging the exhaustible power source subsequent to the exhaustible power source passing the condition testing.

U.S. Pat. No. 6,879,479 discloses an apparatus for sensing and measuring the HV surge arrester current includes two toroidal current transformers arranged coaxially with respect to the earth wire of the surge arrester, elements for sensing the current signals emitted by the transformers and for converting the current signals in digital signals, and elements for transmitting the digital signals to an information network and analog state signals by relay activation. The two toroidal current instrument transformers are associated, respectively, one to elements for sensing the normal leakage current, and the other to elements for sensing the impulsive current, the latter comprising a circuit (TRIGGER) discriminating between "switching" and "lightning" signals, in which the basis for discrimination is a signal duration threshold, of about 35 ps.

U.S. Pat. No. 6,914,763 discloses a utility power distribution system having at least one primary electric power source and at least one secondary electric power source, each of said primary and secondary sources being connected to the distribution system through respective controllable circuit breakers, further comprising communication signal generating apparatus arranged for introducing a communication signal into the power distribution system from the connection of the primary power source, communication signal receiving apparatus arranged for receiving the communication signal via the power distribution system at the secondary power source, and apparatus responsive to the interruption of receipt of the communication signal at the receiving apparatus for operating the circuit breakers at the secondary power source for disconnecting the secondary power source from the power distribution system.

U.S. Pat. No. 7,076,378 discloses an apparatus for determining a characteristic of a portion of a power line. The apparatus comprises a coupling device in communication with a processor. The coupling device receives a signal from a power line and the processor receives the signal from the coupling device and determines a characteristic of a portion of the power line based on the received signal.

U.S. Pat. No. 7,113,134 discloses an antenna device, system and method of installing the antenna device for receiving a wireless signal at a pad mounted electrical transformer. The device includes an antenna capable of communicating the wireless signal and a material located around the antenna. The material facilitates attachment to the pad mounted electrical transformer as well as preventing access to the antenna. The antenna may be covered by or embedded within the material. The material may be emissive and/or insulative. In addition, the device may include a conductor that passes through an enclosure of the pad mounted transformer. The conductor may be communicatively coupled to a first communication device that provides communication to a customer premise that is electrically coupled to the pad mounted electrical transformer.

U.S. Pat. No. 7,248,158 discloses an automated meter reading power line communications system which may include measuring the utility usage of a first customer premises to provide first utility usage data, storing the first utility usage data in memory of a first device, wirelessly transmitting the first utility usage data from the first device, receiving the wirelessly transmitted first utility usage data at a second device coupled to a medium voltage power line, and transmitting the first utility usage data over the medium voltage power line.

U.S. Pat. No. 7,436,321 discloses a method of communicating utility usage data is provided. In one embodiment, the method comprising transmitting real-time utility usage data from a plurality of utility meters, receiving the real-time utility usage data from the plurality of utility meters, storing the real-time utility usage data in a memory, storing address information of the plurality of utility meters in memory, receiving requests from a plurality of utility users for real-time utility usage information and wherein the requests traverse a communication path that includes the Internet, processing the utility usage data of the utility users to provide the real-time utility usage information for each utility user, and transmitting the real-time utility usage information to the utility users over a communication path that includes the Internet.

U.S. Pat. No. 7,453,352 discloses transmitting data signals between a power line and a computer, wherein the power line provides power to the computer via a distribution transformer and the computer is in communication with a wireless communication path. A first data signal is communicated with the power line. A conversion is made between the first data signal and a second data signal capable of being communicated wirelessly. The second data signal is wirelessly communicated with the wireless communication path.

U.S. Pat. No. 7,626,489 discloses a power line communication system network element that provides communications to one or more user devices. The device may also receive data from one or more sensors, such as current sensors, a voltage sensor, a video camera, a temperature sensor, a barometer, a motion sensor, a level sensor, and/or a vibration sensor. The device may include a controller that receives commands that relate to the collection and transmission of the sensed data via a medium voltage power line.

U.S. Pat. No. 7,701,325 discloses communication device for use with a power line communication system. One embodiment forms a bypass device and comprises a LV coupler, a LV signal conditioner, a controller, a MV modem, a first MV signal conditioner, an isolator, a second MV signal conditioner, and a MV coupler. The controller may provide routing functions to give priority to certain types of data, control access to the network, filter data packets, process software upgrades, and provision new subscriber devices. In addition, the controller may monitor, process, and transmit traffic data, measured power data, errors, and other collected data.

U.S. Pat. No. 7,705,747 discloses a sensor network for monitoring utility power lines comprises a sensor disposed for monitoring utility power lines, the sensor capable of acquiring data related to the utility power lines and communicating sensor data; a first remote sensor interface (RSI) comprising a data communications device capable of receiving the sensor data communicated from the sensor, and transmitting data relating to the received sensor data; and a data communications device capable of receiving the data transmitted by the first RSI and transmitting data related to the sensor data directly or indirectly to a network external to the sensor network. The sensor network comprises a common designation network.

U.S. Pat. No. 7,714,592 discloses a system and method of detecting changes in the impedance of a segment of medium voltage power line is provided. In one embodiment, the method comprises receiving voltage data comprising data of the voltage of the power lines at locations at a plurality of different points in time, receiving current data that comprises data of the current flowing between adjacent locations at the plurality of points in time, intermittently determining an impedance of the power lines between adjacent locations based on the voltage data and current data, monitoring the impedance of the power lines between adjacent locations over time, and providing a notification of a change in the impedance of a power line between adjacent locations upon detection of a change in the impedance beyond a threshold change.

U.S. Pat. No. 8,077,049 discloses a system, device, and method of providing information for a power distribution system is provided. In one embodiment, a method of using a device that receives power from the low voltage power of the power distribution system and experiences a power loss during a local power outage may perform the processes of monitoring a voltage of the low voltage power line, detecting a voltage reduction below a threshold voltage for a predetermined time period, storing information of the voltage reduction in a non-volatile memory prior to the power outage, and transmitting a notification to a remote computer system prior to the outage. The monitoring may comprise making a plurality of measurements of the voltage during a time interval and averaging the plurality of voltage measurements. In addition, the method may include transmitting an alert message upon power up after the outage to indicate a power restoration local to the device.

U.S. Pat. No. 8,336,352 discloses a transient detector and fault classification system comprising an algorithm that detects transients which may result from the occurrence of a fault in the power distribution system. The system includes a detection module which processes a set samples obtained from electrical waveforms propagated of through the power distribution system and appear to be statistically anomalous compared to other sample data. This is done using an adaptive detection algorithm that is applied when large changes occur in a waveform over a relatively short period of time. The identified samples are then provided to a signal classifier module which processes sets of samples to classify a transient they represent as a likely fault occurrence or some other type of anomaly which is likely not a fault occurrence. If a transient is classified as representing a likely fault occurrence, a polling module polls users of the distribution system to determine if a fault has occurred within the distribution system, and, if so, where.

U.S. Pat. No. 8,509,953 discloses a smart grid for improving the management of a power utility grid is provided. The smart grid includes using sensors in various portions of the power utility grid, using communications and computing technology, such as additional bus structures, to upgrade an electric power grid so that it can operate more efficiently and reliably and support additional services to consumers. Specifically, the additional bus structures may comprise multiple buses dedicated to the different types of data, such as operational/non-operational data, event processing data, grid connectivity data, and network location data. The multiple buses may comprise different segments in a single bus or may comprise separate buses. The multiple buses may be used to transport the various types of data to other smart grid processes (such as at a centrally located controller).

U.S. Pat. No. 8,674,843 discloses a system and a method for detecting and localizing abnormal conditions and electrical faults in an electrical grid are provided. A method includes receiving a notification message including a state of an electrical component on an electrical grid. The method further includes displaying, by a computing system, an alarm message indicating the state of the electrical component to a system operator responsible for the electrical component such that system operator is able to determine at least one action to take in response to the state of the electrical component.

U.S. Pat. No. 8,779,931 discloses a system, device, and method of providing information for a power distribution system is provided. In one embodiment, a method of using a device that receives power from the low voltage power of the power distribution system and experiences a power loss during a local power outage may perform the processes of monitoring a voltage of the low voltage power line, detecting a voltage reduction below a threshold voltage for a predetermined time period, storing information of the voltage reduction in a non-volatile memory prior to the power outage, and transmitting a notification to a remote computer system prior to the outage. The monitoring may comprise making a plurality of measurements of the voltage during a time interval and averaging the plurality of voltage measurements. In addition, the method may include transmitting an alert message upon power up after the outage to indicate a power restoration local to the device.

U.S. Pat. No. 8,810,421 discloses a system, computer program product and method to provide information related to a power distribution system based on information provided by a plurality of network elements electrically connected to a plurality of power lines of the power distribution system at a plurality of locations is provided. In one embodiment, the method comprises receiving a notification from a group of network elements that have detected a voltage signature indicating an imminent power outage, determining location information of the power outage, outputting the location information of the power outage, receiving a live notification from a first network element of the group of network elements indicating a first power restoration at a location of the first network element, determining location information of the first power restoration, and outputting the location information of the first power restoration.

Thus, it is an object of the present invention to provide a downed power line sensor contained in a single package that also performs the function of the insulator. It is a further object of the present invention to provide a drop-in replacement for current power line pin-type insulators, allowing it to be easily incorporated into the grid without changes in the methodology of grid construction. It is a further object of the present invention that the sensor can be installed on a utility pole or cross arm using existing methods and techniques, that the sensor does not have any external wiring or other mechanical connections. The sensor operates off of battery power so that it can function in the absence of line power. When current is flowing on the line, the battery is charged by an energy harvesting component incorporated into the sensor.

It is a further object of the present invention to measure line current and voltage. Whether or not a power line is downed cannot be identified with certainty by only measuring line current and voltage. Therefore, to overcome that uncertainty, in addition to measuring the current and voltage on the power line, it is an object of the present invention to measure the tension in the power line, enabling the system to indicate a power line is down or in contact with an object.

SUMMARY

A wireless sensor apparatus for determining and reporting the status of an electrical wire, said sensor apparatus comprising: an electrically insulated housing; a non-contact electrical energy harvesting device, said energy harvest device disposed within said housing, said energy harvesting device comprising an electric current detector and voltage detector; an electric power source, said power source operatively connected to said energy harvesting device; a microcontroller, said microcontroller operably connected to said power source; a mechanically rigid base, said base operably connected to said housing and to said at least one strain gauge, said at least one strain gauge operably connected to said power source and to said microcontroller; a wireless data transmission antenna, said wireless data transmission antenna operably connected to said power source and to said microcontroller; a visual display, said visual display operably connected to said power source and to said microcontroller.

A wireless sensor apparatus for determining and reporting status of an electrical wire, said sensor apparatus physically disposed in contact with said wire and comprising: an electrically insulated housing; a means for wireless electrical energy harvesting, said means for wireless electrical energy harvesting disposed within said housing; a means for providing electrical power to said sensor apparatus, said means for providing electrical power operatively connected to said energy harvesting device; a microcontroller, said microcontroller operably connected to said apparatus; a means for measuring the mechanical load on said housing, said means for measuring the mechanical load on said housing operably connected to said microcontroller; a means for determining the presence of an electric current through said electrical wire, said means for determining the presence of an electric current through said electrical wire operably connected to said microcontroller; a means for determining the presence of an electric voltage within said electrical wire, said means for determining the presence of an electric voltage operably connected to said microcontroller; a means for wireless data transmission, said means for wireless data transmission operably connected to said microcontroller; a visual display, said visual display operably connected to said microprocessor.

A method of sensing and reporting the mechanical and electrical status of a power line, said method comprising the steps of: providing a sensor, where said sensor harvests power from a proximate power line; using said sensor to detect the current in an proximate power line; using said sensor to detect the presence of a voltage in said power line; using said sensor to detect the mechanical load on said power line; using said sensor to communicate the mechanical and electric status of said power line to a system user.

BRIEF DESCRIPTION OF THE DRAWINGS

The present invention will be understood more fully from the detailed description given hereinafter and from the accompanying drawings of the preferred embodiment of the present invention, which, however, should not be taken to limit the invention, but are for explanation and understanding only.

In the drawings.

DETAILED DESCRIPTION OF THE EMBODIMENTS

The present invention will be discussed hereinafter in detail in terms of various exemplary embodiments according to the present invention with reference to the accompanying drawings. In the following detailed description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessary obscuring of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations.

All of the implementations described below are exemplary implementations provided to enable persons skilled in the art to make or use the embodiments of the disclosure and are not intended to limit the scope of the disclosure, which is defined by the claims. In the present description, the terms "upper", "lower", "left", "rear", "right", "front", "vertical", "horizontal", and derivatives thereof shall relate to the invention as oriented in FIG. 1.

Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

As described above, prior art downed power line sensors attempt to determine whether a power line is down and energized based solely on algorithms using only the inputs of current and voltage. However, these inputs alone are unlikely to reliably and accurately indicate the status of a power line. For example, current and voltage may be absent even when the power line is still mechanically sound.

The system of the present invention, however, adds another input, tension on the line, to monitor whether the mechanical load on the power line has changed. Used together, information based on all three types of inputs: current, voltage, and tension, provides a dependable indication of the "status" of a powerline. The status of a powerline, includes whether the powerline is physically in good condition and whether a power line is energized.

Figure 1:
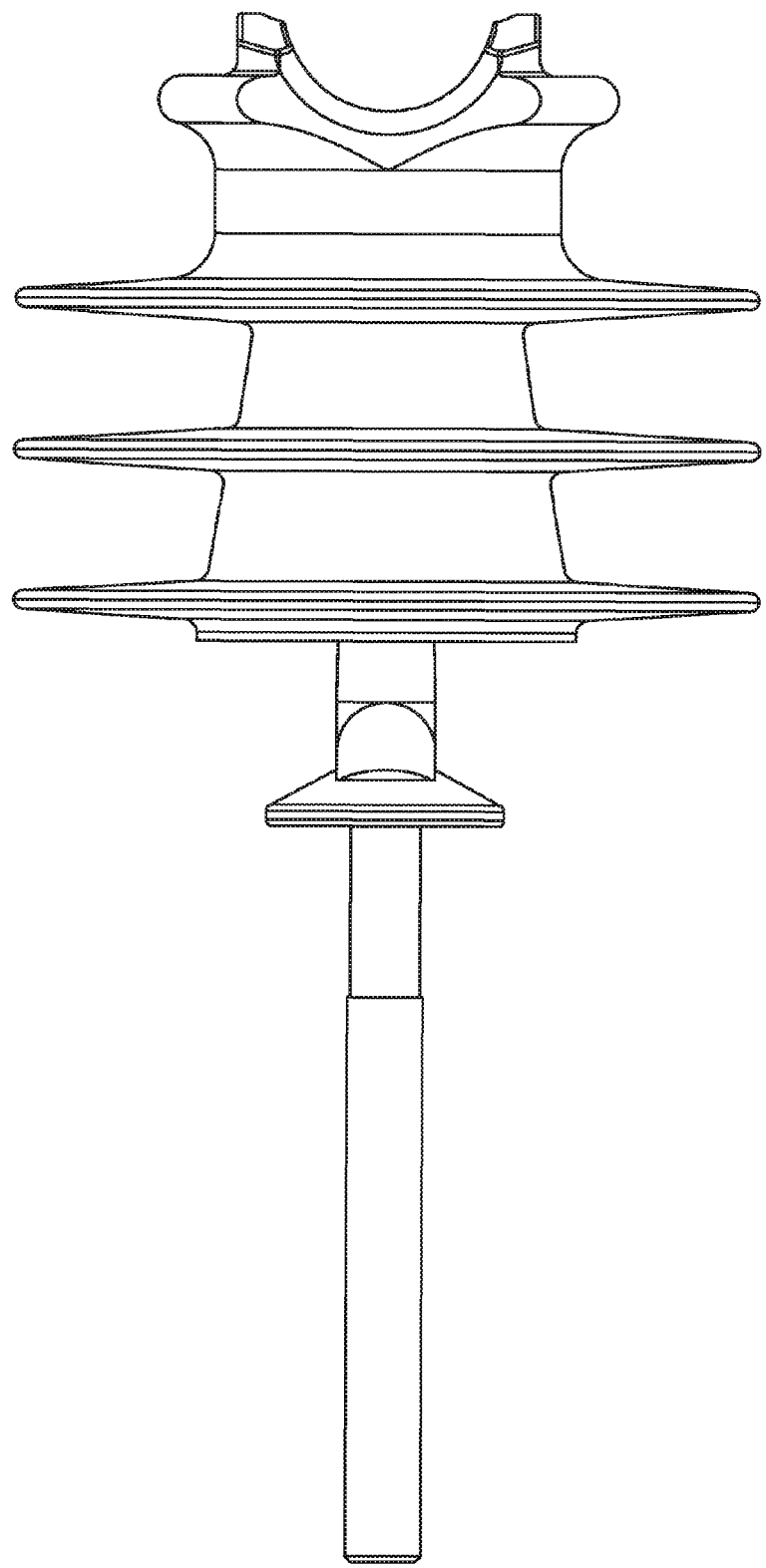
FIG. 1 shows a side elevation view of a prior art pin type insulator.
Figure 2:
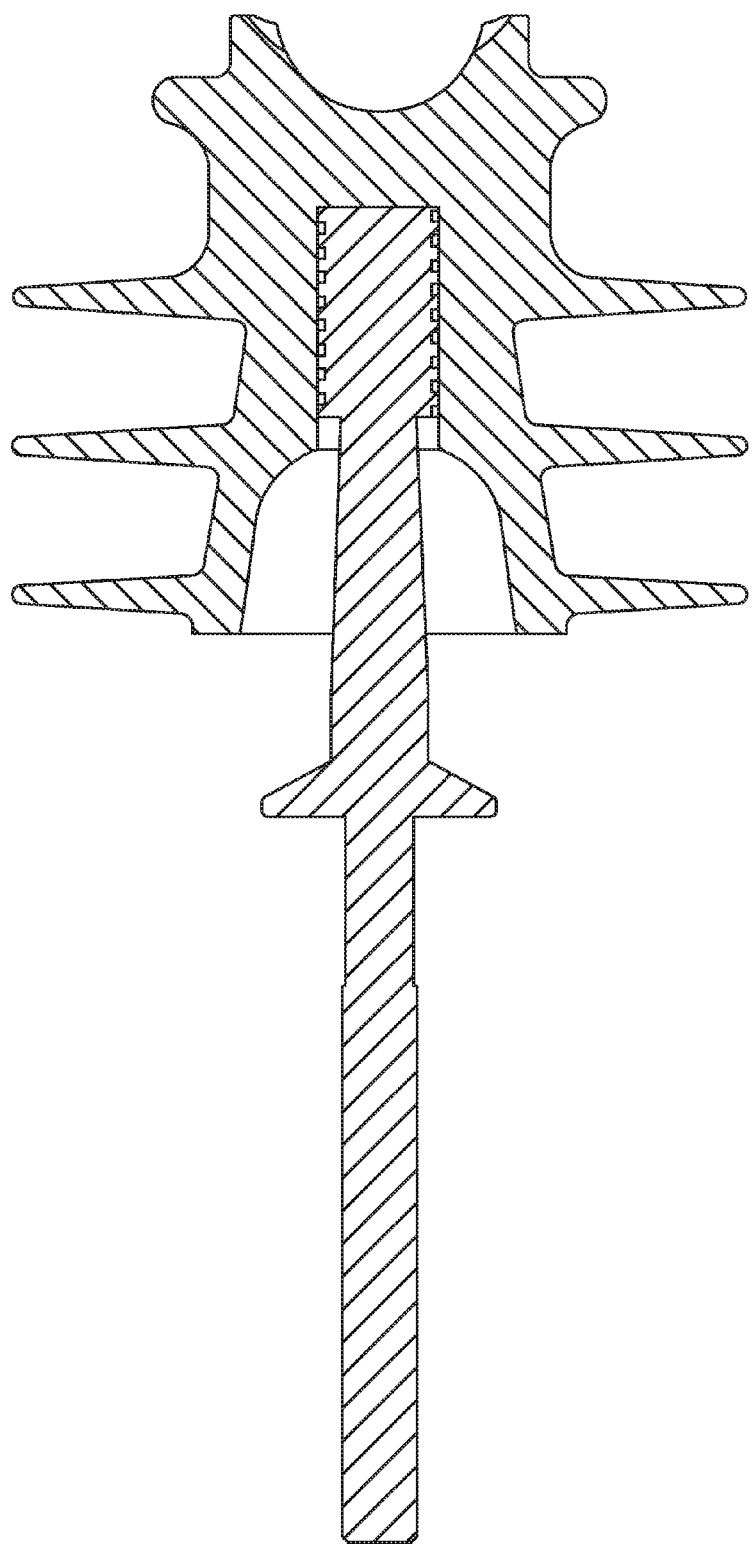
FIG. 2 shows a cross sectional view of the prior art insulator of FIG. 1.

Referring first to FIG. 1, there is shown a prior art pin-type insulator for use in conjunction with overhead utility power lines. FIG. 2 further illustrates a cross-sectional view of the pin-type insulator shown in FIG. 1. As illustrated in FIGS. 1 and 2, prior art insulators generally comprise a housing comprising a non electrically conducted material such as high density polyethylene ("HDPE"). The housing is disposed about a top end of a metal post as shown in FIG. 2. In the side elevational view and side cross sectional views shown in FIGS. 1 and 2, respectively, the housing of the prior art insulator is generally symmetric about its vertical axis. The prior art insulator housing further comprises a plurality of rings vertically offset from one another and extending from the center of the housing. The rings taper distally from the center of the housing.

The apparatus of the present invention, has been conceived of to replace prior art pin-type insulators, illustrated in FIG. 1 and in FIG. 2, and currently in use on utility poles or cross-arms with a downed power line sensor according to the present invention.

Figure 3:
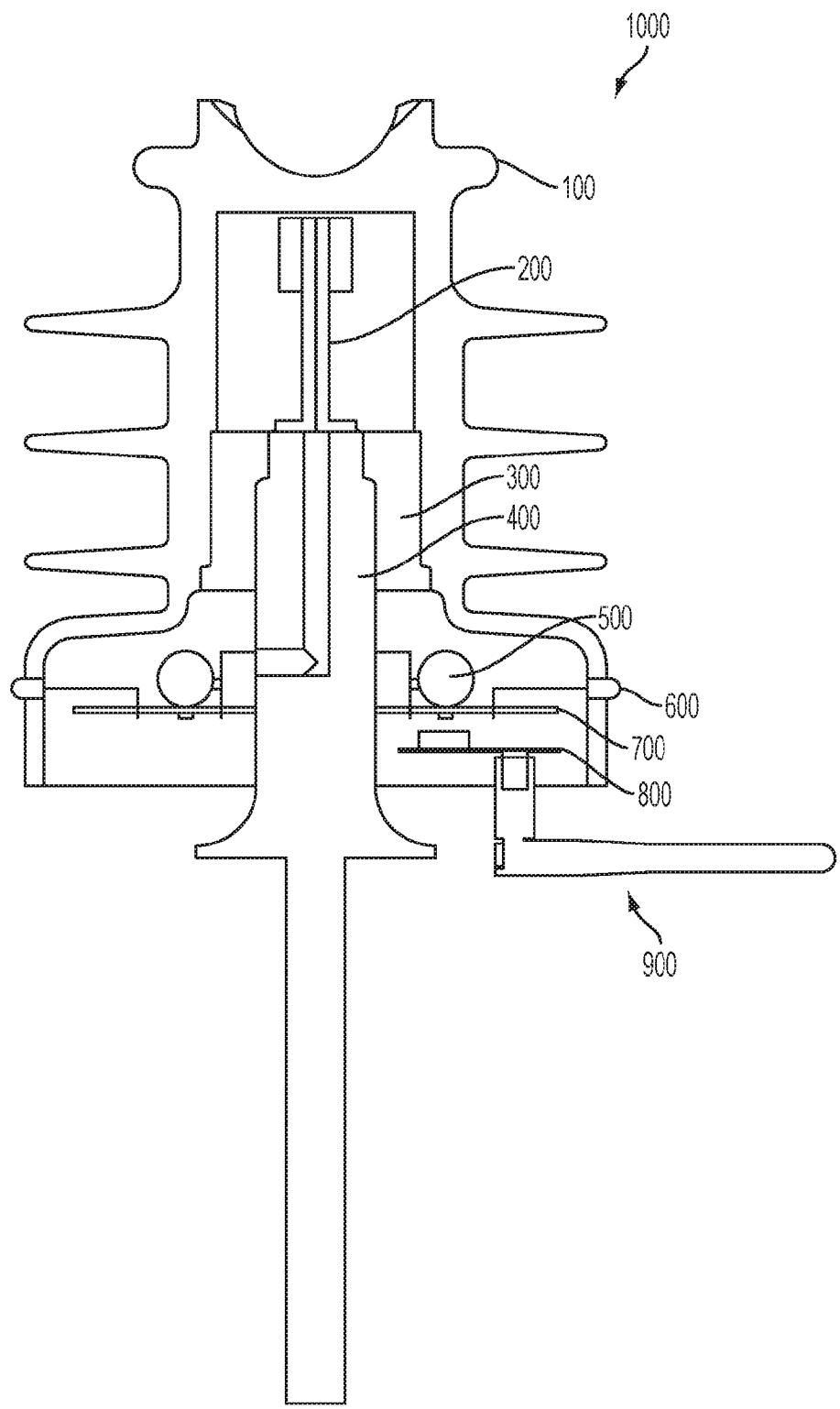
FIG. 3 shows a side cross sectional view of an exemplary embodiment of a power line status sensor according to the present invention.

Referring now to FIG. 3, downed power line sensor 1000 of the present invention generally comprises insulator housing 100. Insulator 100 is preferably a single molded piece generally comprising a non electrically conductive material such as HDPE and generally cylindrical cavity accessible from the bottom such that insulator housing 100 can be disposed over non-contact energy harvester 200; adapter plug 300; load cell post 400; rechargeable batteries 500; LEDs 600; system controller 700; communications module 800; and RF antenna 900.

Referring still to FIG. 3, communication module 800 further comprises a single donut shaped circuit card containing a microprocessor, load cell electronics, and a battery charger, connected to rechargeable batteries 500. Module 800 controls all electrical functions within downed power line sensor 1000. It distributes power to the other elements, monitors the load cell, controls the system logic, sends status to the visual status indicator, and sends alerts to the communications module.

Figure 8:
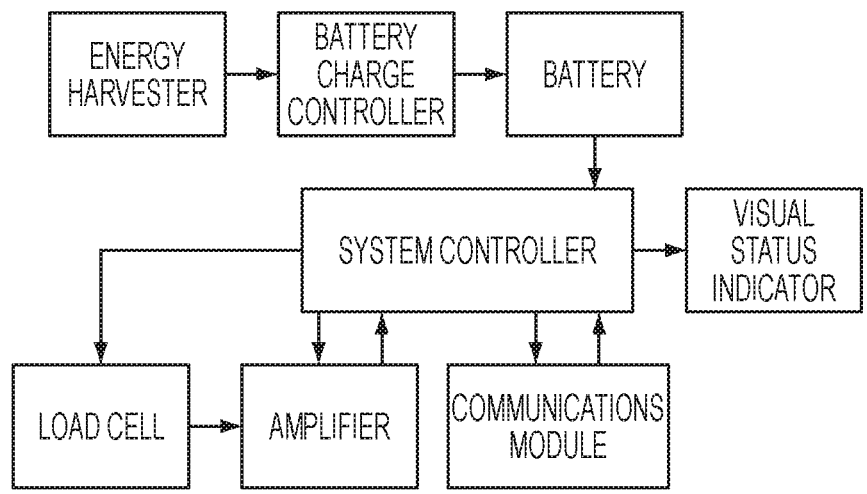
FIG. 8 shows a block diagram of the overall control logic of an exemplary embodiment of a power line status sensor according to the present invention.

Communications module 800 is further operatively connected to radio frequency ("RF") antenna 900 for wireless communication of a power line's status (energized, non energized, in place, fallen, etc.) with a system provider such as a utility company or a government, military, or local safety agency, such as a police or fire department. Communications module 800 is further operatively connected to system controller 900. The system controller circuit card of controller 900 will be designed and built around a microcontroller or equivalent that provides the logic which defines the system functionality. An electrical block diagram of the system controller circuit card of sensor 1000 electronics is shown in FIG. 8.

Referring still to FIG. 3, insulator housing 100 of downed power line sensor 1000 comprises collinear cavities in which non-contact energy harvester 200 is electronically connected to batteries 300 is disposed. The subassembly of energy harvesters 200 and rechargeable batteries 300 is placed atop and operably connected to system controller 700, communications module 800, and RF antenna 900. Referring still to FIG. 3, downed power line sensor 1000, further comprises a load cell post 400 and an adaptor plug 300 for operably attaching energy harvester 200.

Figure 4:
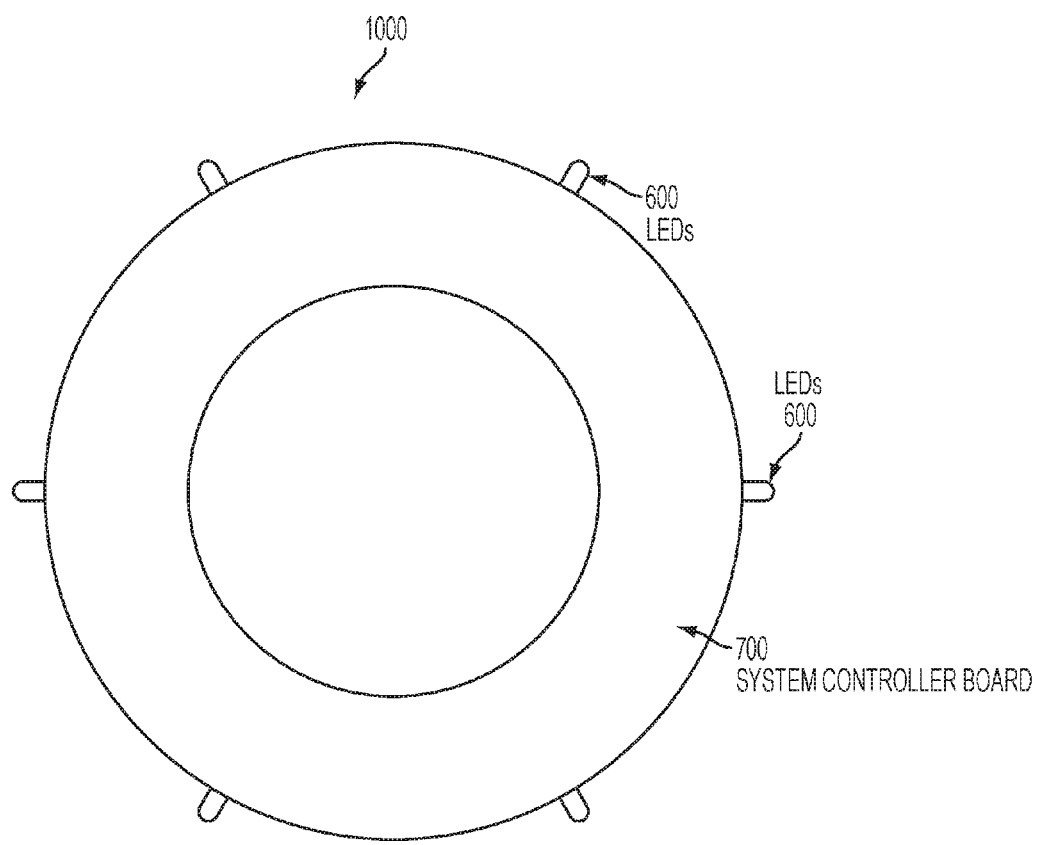
FIG. 4 shows a top view of the power line status sensor of FIG. 3.
Figure 5:
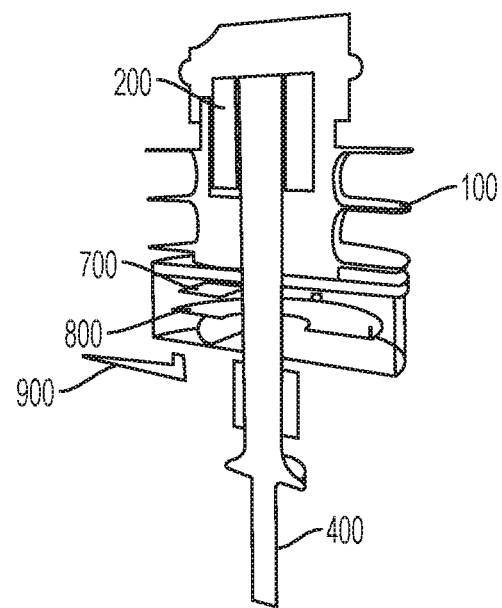
FIG. 5 shows a side cross-sectional view of an alternative exemplary embodiment of a power line status sensor according to the present invention.
Figure 6:
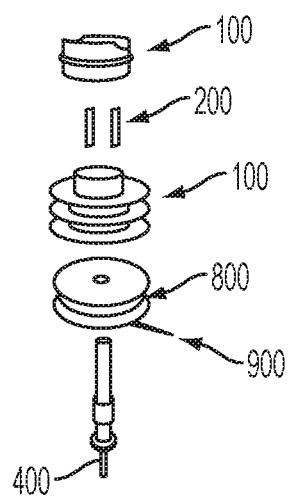
FIG. 6 shows an exploded side assembly view of the status sensor of FIG. 5.

Referring still to FIG. 3, sensor 1000 further comprises at least one LED 600 operably connected to system controller 700 and rechargeable batteries 500. Controller 700 instructs LEDs 600 to flash or other wire function to display power line status information. FIG. 4 shows a top view of system controller 700. As illustrated FIG. 4, controller 700 preferably comprises a plurality of LEDs 600 disposed around the circumference of sensor 1000.

Figure 10:
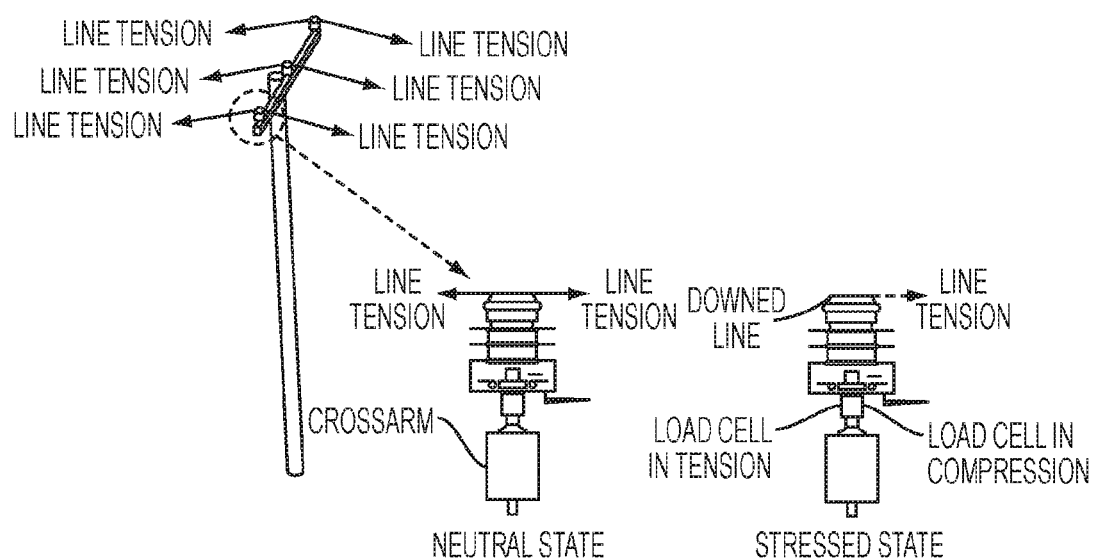
FIG. 10 shows a perspective side view of a power line status sensor according to the present invention, where said sensor is installed on a power line.

Shown in FIG. 10, a utility power line is attached to the top of sensor 1000 using the same techniques as a standard insulator. The close proximity of the conductor with the sensor permits an energy harvesting system to charge a battery which will power the sensor 1000. In the preferred embodiment of the present invention, the energy harvesting system comprises alternating electrical energy harvesters 200.

Alternating current ("AC") energy scavenging for electric power system sensing is presently implemented using coil-based approaches. Coil-based energy scavengers can be categorized as current transformers, flux concentrators, or Rogowski coils. Current transformers are by far the most common coil-based AC scavenging method. A current transformer's core can be either continuous, and the conductor has to be disconnected for installation, or split and the scavenger is installed around the conductor. The degradation of the gap over time in a split core current transformers may cause leakage of the magnetic flux, and cause calibration problems if the scavenger is also used as a current sensor. When the current-carrying conductor cannot be fully encircled by the AC scavenger, such as in the case of "stickon" sensors, a flux concentrator with a core that only partially encircles the conductor can be used. The magnetic coupling in this type of energy scavenger is drastically reduced compared to a current transformer due to increased reluctance of the magnetic circuit (most of the flux must now travel through air). A Rogowski coil corresponds essentially to a current transformer with an air-core, and is frequently used for current sensing application. Although the coil surrounds the conductor, the lack of a rigid core facilitates the installation. However, a Rogowski coil is generally not used as a current scavenger due to its low coupling efficiency.

Energy harvesters 200, however, preferably instead comprise permanent magnets attached to a piezoelectric beam in the electric field surrounding the conductor will cause the magnets to oscillate at the same frequency as the alternating current in the power line. This oscillation causes a deflection in the piezoelectric beam, creating power that can be harvested to charge the battery powering the sensor. There is no electrical contact with the utility power line and there is sufficient insulating material between the magnets and the power line to allow the sensor to be a fully functional insulator. This energy harvesting technology is fully described in Igor Paproiny, et al., *Electromechanical Energy Scavenging from Current-Carrying Conductors* (IEEE Sensors Journal 2011 and Qiliang Richard X U, et al., *Miniature Self-Powered Stick-On Wireless Sensor Node for Monitoring Overhead Power Lines* (Berkeley Sensor and Actuator Center). The entire disclosure of these papers is hereby incorporated herein by reference.

Thus, as illustrated in FIG. 8, energy harvesters 200 of the present sensor 1000 comprise electromechanical AC energy scavenging devices that use permanent magnets to couple an electromechanical resonator to the current flowing in a nearby conductor. The alternating magnetic field excites the magnets, which constitute the proof mass of the mechanical resonator. The resulting strong coupling combined with resonance at standard electrical power frequencies (e.g. 50 Hz or 60 Hz) enables the scavenger to generate more power than can be obtained by using comparable coil-based approaches. Alternatively, energy harvester 200 may comprise a vibrational energy scavenging device. In any case, however, energy harvester 200, further comprises voltage and current detectors (not shown) of known design. In the absence of current flow, energy harvester 200 still detects voltage in the electric field surrounding the power line.

Figure 9:
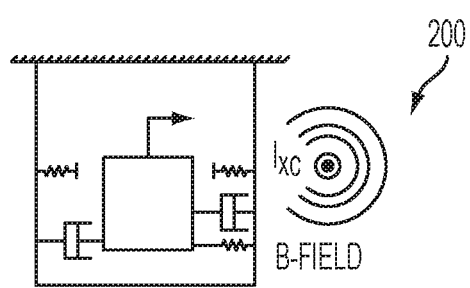
FIG. 9 shows a functional schematic diagram of an energy harvester for use in an exemplary embodiment of a power line status sensor according to the present invention.

Referring to FIG. 9, electromechanical AC energy harvester 200 generally comprises a permanent magnet which also doubles as the proof-mass, a spring with stiffness k, mechanical, and electrical damping. Electromechanical AC energy scavenging is similar in principle to electro-dynamic wireless power transfer, however the present device uses piezoelectric (as opposed to electromagnetic) coupling to convert the energy from the mechanical domain.

Again referring to FIG. 9, the general model of electromechanical AC energy harvester 200 comprises an underdamped 2nd order resonating mass-spring system. The moving mass is subject to mechanical damping, while the output energy of the scavenger is extracted through a transducer (a piezoelectric cantilever), and corresponds to the electrical damping.

In contrast to vibrational energy scavenging, electromechanical AC energy scavenging uses permanent magnets as the resonating mass. These magnets are excited by the force from the alternating magnetic field generated by the current in a nearby conductor. If the frequency of force matches the resonant frequency of the electromechanical system, the amplitude of the displacement of the mass, and correspondingly the output power, is maximized. A stopper spring limits the motion of the magnetic mass (and prevent the generation of excessive stresses in the piezoelectric layer) during large excitations.

Energy harvester 200, further comprises voltage and current detectors (not shown) of known design. If energy harvester 200 is collecting power line is harvesting power. In the absence of current flow, energy harvester 200, still detect current voltage in the electric field surrounding the power line.

Referring again to FIG. 3 or to the alternative embodiment of FIG. 4, sensor 1000 further comprises a load cell post 400 upon which the electronics of sensor 1000 are disposed. Load cell post 400 comprises strain gauges (not shown) to monitor the mechanical load on post 400. The strain gauges are connected electronically to sensor 1000 capable of measuring the forces acting on load cell post 400.

Strain gauges are used to measure force or weight. Because its electrical resistance varies as it is stretched or compressed, a strain gauge measures elongation or compression on the surface to which it is mounted. Using the strain gauge measurement and the mechanical properties of post 400, any forces on post 400 can be determined.

The load cell strain gauges are preferably configured in a Wheatstone bridge configuration. This configuration provides the ability to balance the circuit and compensate for changes in temperature. An amplification circuit connected to the Wheatstone bridge amplifies the output signal from the Wheatstone bridge to increase measurement resolution and improve the signal to noise ratio.

The configuration of load cell post 400 is preferably designed to meet the needs for the targeted range of utility line conductor sizes. For example, standard wire sizes may be 556, 4/0, and 2/0 AAC or 477, 3/0, and #2 ACSR. Conductors may have a design line tension of 800-3,600 pounds. If a line with these tensions was to be severed and the full line tension placed on the load cell, the strain exerted on load cell post 400 will be well within the capabilities of the strain gauges.

The base of the load cell post 400 further comprises mounting bolt 500 necessary to attach the complete sensor to the utility pole or cross-arm. Based on the pin type insulator hardware currently used, sensor 100 will be robust and at least as structurally strong as the insulators it will replace. To quantify the tension variations, the load cell strain gauges measurements need to be electrically amplified and manipulated. The circuitry required for this is included in electronic module 800 and controller 700 of sensor 1000.

Figure 7:
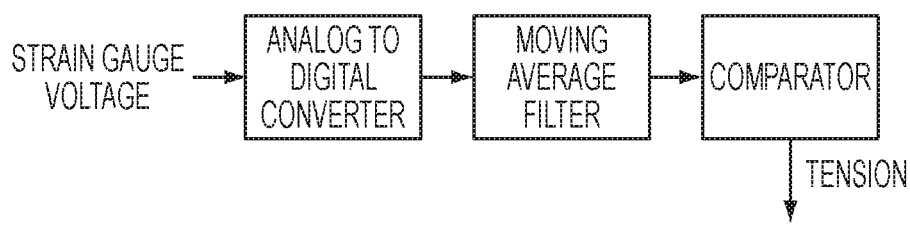
FIG. 7 shows a block diagram of the control logic for the load sensing aspect of an exemplary embodiment of a power line status sensor according to the present invention.

As shown in FIG. 7, a moving average filter is applied by electronic module 300 to the strain gauge measurements. This design prevents false positives due to phenomena such as galloping of the line and other intermittent line movements. The resulting measurements can then be compared to established limits to further prevent false positives and create the downed line alert message.

The present invention may further comprise an accelerometer to identify instances of sudden mechanical failure in a power line. If the tension event breaks the utility pole cross arm, the accelerometer will sense that movement. This information will be included in the alert message to tell the user that the damage to the pole is more significant and additional crew may be needed.

To work within the power budget, the load cell preferably operates on a 1-second duty cycle. However, those of skill in the art will appreciate that the duty cycle may be adjusted to match capability of the energy harvester. For example, the power budget may place the load cell controller on a 10% duty cycle, and the strain gauge excitation on a 20% duty cycle, allowing time in each 1-second cycle for the gauges to thermally stabilize before the measurement is taken, increasing the load cell accuracy.

Most of the Wheatstone bridge excitation and measurement can be handled by standard integrated circuit chips. Each branch of the Wheatstone bridge may, for example, have nominal resistance of 1000 Ohms, so the excitation current supplied to the load cell is 3 mA and the excitation power is 9 mW.

Referring now to FIG. 10, sensor 1000 monitors the differential force between the line tension in both directions along the axis of the power line. When the sensor is initially installed and the line powered, a baseline will be electronically established. This baseline will have approximately the same tension in the line in both directions. In the event that a line is taken down, the tension in that span will decrease, causing an increase in strain in the load cell.

As illustrated in FIG. 10, sensor 1000 is attached to a power line of interest. Tension in the power line is monitored by measuring the load on post 400 of the sensor 1000 which is physically connected to insulator housing 100. Thus, changes in the tension on the power line will cause minute deflections in load cell post 400, which the strain gauges detect.

When approximately equal forces are applied to the sensor load cell via the power line attached to insulator 100, the load cell post is in an approximately neutral state, where the outer surface is in neither compression nor tension, as represented by the center image of FIG. 10. If the line on one side of the sensor 1000 is broken, the tension decreases in the direction of the break and increases in the opposite direction as represented by the right image of FIG. 10.

Conversely, if a fallen tree or other object is contacting the line, it increases the tension in that section of line and the load on load cell post 400.

Downed power line sensor 1000 of the present invention ideally provides "real time" information about the mechanical (downed line) and electrical (energy state) status of a power line to the system user, which may be a government agency, a utility provider, the military, or public safety agency, such as the police or fire department. To accomplish this, power line status sensor 1000 further comprises antenna 900 functionally connected to communications module 800 as shown in FIGS. 3 and 4. Information about the status of a power line collected by sensor 1000 can then be sent to the system user via a wireless communications network.

Additionally, power line sensor 1000 preferably includes an indicator, such as LEDs 600, that provide information to first responders and others at the scene regarding whether a downed power line is energized.

When the Downed Power Line Sensor is installed and the line is initially energized, the sensor establishes the baseline condition for the load cell. In the event of a downed power line, because the sensor is monitoring current and voltage on the line, it can generate an alert that a power line has experienced a tension event and indicates whether the line is energized. An energized state exists where either current or voltage is present. An alert may will be displayed on a visual indicator or sent to a remote utility service provider or other system user via a wireless communications network.

In a preferred embodiment, the visual status indicator in sensor 1000 consists of multicolored high output LEDs 600 equally spaced around the outside of the electronics board. Each of LEDs 600 has an adequate, preferably 120 degree, viewing angle so when they are placed around the edge of the board, the viewing angle of adjacent LEDs 600 will overlap, ensuring that LEDs 600 are visible in any direction around the sensor. The visual indicator on sensor 1000 enables first responders or restoration workers on scene to determine the status of the sensor and of the downed line.

LEDs 600 are able to illuminate in red, blue, and green light. While the preferred power budget is based on an appropriate blink sequence once a minute, stored energy will be available to increase that rate as desired. When sensor 1000 is functioning normally, LED 600 will flash a desired color light for predetermined intervals. This enables first responders on scene to know the sensor is functioning. When a line is downed, sensor 1000 can have a set number, preferably 3, of consecutive blinks in either red or green. Sensor 1000 will preferably cause LEDs 600 to flash a green light when the power line is down and the line is not energized and a red light when the power line is down but energized. Sensor 1000 may further comprise an audio indicator if a tension or energy event occurs.

By flashing LEDs 600, it is easier to see in daylight. To increase daytime visibility, an additional dark surface can be placed around each LED 600 to increase the contrast. Sensor 1000 may further comprise a reflective surface around LEDs 600 to further increase the daytime visibility of the same.

A passive mechanical status indicator may be used to indicate the alert status of the sensor. However, if the sensor was to fail or be damaged with the passive indicator in the "safe" display mode and the line was actually energized, the sensor would wrongly indicate a non-energized line and create a significant safety hazard. Thus, it is preferred that the visual indicator incorporate an active an active flashing LED 600, so that first responders on scene can know with certainty that the sensor is functioning properly.

The power required for the continuously operating a blue flashing LED 600 is minimal and does not have a significant impact on the overall power required by the sensor. Each LED 600 has a current draw and a supply voltage. This power will be supplied by the sensor battery, which is charged by the energy harvester. In the event of a downed power line, the stored energy will allow the LEDs 600 to flash red or green three consecutive H second blinks, once every minute, for a minimum of 168 hours (1 week), based on a power usage of 3.2 mW. However, the battery has excess capacity so alternative flash patterns can be explored if so desired.

In the preferred embodiment of the present invention, at all times when the sensor is functioning and monitoring the power line status, an LED visual status indicator will flash. When a tension event has occurred, the LED will flash different colors at different intervals. For example, red may indicate the line is energized, and green may indicate it is not energized. The blink pattern time, interval, and duration can be modified as desired because there is ample power capacity in the battery. The system may further compromise a manual or automatic reset switch.

As previously stated, sensor 1000 further comprises means for transmitting status information about the power line to remote system users, such as utility companies. However, most such potential system users have an existing version of network communications. For example, each electric utility has its own network communication system for smart metering and other grid monitoring. Thus, sensor 1000 of the present invention comprises adequate power, signal input, and antenna access to support a range of communication modules that interface with the leading communications networks already in use. Multiple candidate networks can be used, and communications modules capable of communicating them are commercially available.

As shown in FIG. 10, when sensor 1000 is installed on a power distribution line, the communication module it contains will have a unique physical address, such as a MAC address or similar. That address is transmitted to the utility provider as part of the alert message, identifying sensor 1000 which originated the alert message. Each individual sensor 1000 is associated with the geographical location and serial number of the pole on which it is installed, so the alert message will inherently identify the geographical location of its origin. Because each sensor 1000 will be serialized for location recording at time of installation, a system user, such as a utility company will know which pole the sensor is on and where to respond.

Again, the system controller coordinates all electrical functions within sensor 1000. System controller 700 distributes power to the other elements, monitors the load cell, controls the system logic, sends status to the visual status indicator, and sends alerts to the communications module.

In a preferred embodiment of the sensor 1000, a microcontroller or equivalent, hosts the software that provides the logic which defines the system functionality. The microcontroller within the circuit card receives the following 3 input signals:
1. Current—in the form of power line current detection from energy harvester 200;
2. Voltage—in the form of voltage detection from energy harvester 200; and
3. Mechanical Load—in the form of a load cell voltage, from strain gauges attached to load cell post 400.

Based on these inputs, the electronics provide output signals to the visual status indicator and to remote system users to indicate, for example:
1. The power line is mechanically and electrically sound; or
2. The power line is mechanically sound but un-energized; or
3. The power line is down but energized; or
4. The power line is down and un-energized; or
5. Pole damaged an energized; or
6. Pole undamaged, but energized.

The voltage and current signals are provided via the energy harvester, indicating that line voltage and current are either detected or not detected. Because energy at any level on a downed power line is a hazard, detecting the presence of current and/or voltage is key; quantifying the values of current and/or voltage is an unnecessary complication. Tension alerts are generated by the system controller via the load cell when the tension varies by more than the predetermined value.

The present invention may further comprise an accelerometer added to the control electronics to replace the load cell sensor to determine if the sensor has moved or changed orientation as the result of a downed line. If an event occurs, the accelerometer will sense if the sensor changes angle/orientation and then sensor can alert the user that an event has occurred. The energy harvester would indicate the presence of current and/or voltage on the line so an alert can be sent that an event has occurred and whether the line is energized or not. The accelerometer can also be used to determine if the sensor has moved, indicating that the utility pole cross arm has been broken. This information will be provided to the user in the alert message so they know that additional crew may be needed to repair the damage.

The above-described embodiments are merely exemplary illustrations set forth for a clear understanding of the principles of the invention. Many variations, combinations, modifications, or equivalents may be substituted for elements thereof without departing from the scope of the invention. It should be understood, therefore, that the above description is of an exemplary embodiment of the invention and included for illustrative purposes only. The description of the exemplary embodiment is not meant to be limiting of the invention. A person of ordinary skill in the field of the invention or the relevant technical art will understand that variations of the invention are included within the scope of the claims.

The invention claimed is:

1. An apparatus for supporting an electrical wire and for determining and transmitting the status of the electrical wire, said apparatus comprising: an electrically insulated housing in contact with and physically supporting the electrical wire; said electrically insulated housing being supported on a load cell post; an electrical energy harvesting device disposed adjacent the electrical wire; an electrical power source operatively connected to said electrical energy harvesting device; a microprocessor operatively connected to said electrical power source; a wireless data transmission antenna operatively connected to said microprocessor; an accelerometer operatively supported on said load cell post and connected to said microprocessor, and, wherein an output from said accelerometer is used for determining movement of said electrically insulated housing and thereby determining the status of the electrical wire.

2. The apparatus of claim 1, wherein the electrically insulated housing comprises HDPE.

3. The apparatus of claim 1, wherein said electrical energy harvesting device comprises an electromechanical AC energy harvester.

4. The apparatus of claim 1, wherein said electrical power source comprises a rechargeable battery.

5. The apparatus of claim 1, further comprising a visual display comprising a plurality of LEDs operatively connected to said microprocessor.

6. The apparatus of claim 1, wherein a baseline value is established by said microprocessor from the accelerometer output representative of the approximate static position of the electrically insulated housing, and wherein said baseline value is compared to the accelerometer output for determining a downed electrical wire.

7. The apparatus of claim 6, wherein said accelerometer, said electrical energy harvesting device, said power source and said microprocessor are located within said insulated housing.

8. The apparatus of claim 7, wherein the electrically insulated housing comprises HDPE.

9. The apparatus of claim 7, wherein said electrical energy harvesting device comprises an electromechanical AC energy harvester.

10. The apparatus of claim 7, wherein said electrical power source comprises a rechargeable battery.

11. The apparatus of claim 7, further comprising a visual display comprising a plurality of LEDs operatively connected to said microprocessor.

12. The apparatus of claim 6, wherein the electrically insulated housing comprises HDPE.

13. The apparatus of claim 6, wherein said electrical energy harvesting device comprises an electromechanical AC energy harvester.

14. The apparatus of claim 6, wherein said electrical power source comprises a rechargeable battery.

15. The apparatus of claim 6, further comprising a visual display comprising a plurality of LEDs operatively connected to said microprocessor.

16. The apparatus of claim 1 wherein said accelerometer, said electrical energy harvesting device, said electrical power source and said microprocessor are located within said electrically insulated housing.

* * * * *